United States Patent [19]
Iwasaki

[11] Patent Number: 5,668,050
[45] Date of Patent: Sep. 16, 1997

[54] SOLAR CELL MANUFACTURING METHOD

[75] Inventor: Yukiko Iwasaki, Nara, Japan

[73] Assignee: Canon Kabushiki Kaisha, Tokyo, Japan

[21] Appl. No.: 429,050

[22] Filed: Apr. 26, 1995

[30] Foreign Application Priority Data

Apr. 28, 1994 [JP] Japan .................................. 6-092758

[51] Int. Cl.$^6$ ............................................ H01L 31/06
[52] U.S. Cl. .......................... 438/69; 136/256; 136/258; 148/DIG. 3; 438/609
[58] Field of Search .................................. 437/2, 4, 181; 136/258 AM, 259, 256; 148/DIG. 3

[56] References Cited

U.S. PATENT DOCUMENTS

| | | | |
|---|---|---|---|
| 4,419,533 | 12/1983 | Czubatyj et al. | 136/259 |
| 4,532,372 | 7/1985 | Nath et al. | 136/256 |
| 4,598,306 | 7/1986 | Nath et al. | 136/256 |
| 5,101,260 | 3/1992 | Nath et al. | 136/259 |
| 5,136,351 | 8/1992 | Inoue et al. | 136/258 AM |
| 5,244,509 | 9/1993 | Arao et al. | 136/259 |
| 5,282,902 | 2/1994 | Matsuyama | 136/259 |
| 5,296,045 | 3/1994 | Banerjee et al. | 136/258 AM |
| 5,358,574 | 10/1994 | Sopori | 437/2 |
| 5,415,700 | 5/1995 | Arthur et al. | 437/4 |
| 5,486,238 | 1/1996 | Nakagawa et al. | 136/259 |

FOREIGN PATENT DOCUMENTS

| | | | |
|---|---|---|---|
| 60-041878 | 9/1985 | Japan . | |
| 60-240170 | 11/1985 | Japan | 136/258 AM |
| 0177970 | 3/1989 | Japan | 437/4 |
| 6204528 | 7/1994 | Japan | 136/259 |

OTHER PUBLICATIONS

M. Hirasaka, "Design of Textured Al Electrode for a hydrogenated Silicon Solar Cell", Solar Energy Materials, 20 (1990) 99–110.

*Primary Examiner*—Michael Trinh
*Attorney, Agent, or Firm*—Fitzpatrick, Cella, Harper & Scinto

[57] ABSTRACT

To efficiently mass-produce back reflectors which are inexpensive and have high reflectivity, the invention provides a manufacturing method for a solar cell comprising at least a metal layer having a texture structure and high reflectivity, a transparent layer, a semiconductor layer, and a transparent electrode which are formed on a substrate, wherein the metal layer consists of at least two layers formed as a first metal layer and a second metal layer. The method includes a step of, after forming the first metal layer, annealing the first metal layer before forming the second metal layer. The invention also provides a solar cell manufacturing apparatus having, upstream of a second metal layer forming chamber, a heating chamber in which the first metal layer can be annealed.

14 Claims, 9 Drawing Sheets

SOLAR CELL MANUFACTURING METHOD

BACKGROUND OF THE INVENTION

1. Field of the Invention

The present invention relates to a solar cell manufacturing method and apparatus, and more particularly to a solar cell manufacture method and apparatus which can mass-produce solar cells having high performance at a low production cost.

2. Description of the Related Art

Energy presently consumed by the human beings greatly depends on thermal-power generation using fossil fuel such as petrol and coal, and nuclear power generation. But many problems accompany in continuing large-percentage dependence in future upon fossil fuel that generates carbon dioxide when burnt which is responsible for warming of the atmosphere around the earth, or nuclear power that is not totally free from a risk of exposure to radioactive rays even during normal operation, as well as accidental troubles. Therefore, solar power generation using solar cells, that hardly affects the earth environment, has received an attention and further extensive use thereof is expected.

The current state in the field of solar power generation, however, faces several problems that hinder its widespread practical use.

Heretofore, solar cells for use in solar power generation have been formed of single crystal or polycrystalline silicon. But these solar cells require not only a lot of energy and time for growth of crystals, but also complicated steps after the growth of crystals, and hence have a difficulty in mass-producing the solar cells with high efficiency at a low cost. Meanwhile, the so-called thin film semiconductor solar cells using amorphous silicon (hereinafter referred to as a-Si) or compound semiconductors such as CdS and CuInSe$_2$ have been intensively researched and developed. These thin film semiconductor solar cells can be manufactured by forming semiconductor layers, which are just necessary, on an inexpensive substrate made of glass, stainless steel, etc., with relatively simple steps, and hence have a good possibility that their production cost can be reduced. However, because of lower conversion efficiency than crystal silicon solar cells and uncertain reliability for long-term use, the thin film semiconductor solar cells have not yet been practiced on a large scale up to date. To solve such problems and improve performance of the thin film semiconductor solar cells, there have been proposed various measures as follows.

One proposal is to provide a back reflector to increase reflectivity of light at a front surface of the substrate for returning part of the sunlight which has not been absorbed by the thin film semiconductor layers, to the thin film semiconductor layers again, i.e., for more effectively utilizing the incident light. To this end, in the case of using a transparent substrate and introducing the sunlight from the substrate side, an electrode is formed of any of metals having high reflectivity, such as silver (Ag), aluminum (Al) and copper (Cu), on a surface of the thin film semiconductor layers after forming them. On the other hand, in the case of introducing the sunlight from the surface of the thin film semiconductor layers, the semiconductor layers are formed after forming a similar metal layer on the substrate.

Further, by interposing a transparent layer having suitable optical properties between the metal layer and the thin film semiconductor layers, reflectivity can be increased based on the multiple interference effect as shown in FIG. 1A and 1B. FIGS. 1A and 1B show, respectively, results of simulation tests made on reflectivity of solar cells in which an a-Si layer is directly formed on a metal and solar cells in which zinc oxide (ZnO) is interposed as the transparent layer between a-Si and each of various metals.

The use of the transparent layer is also effective in increasing reliability of the thin film solar cells. For example, Japanese Patent Publication No. 60-41878 describes that the semiconductor and the metal are prevented from mixing into an alloy by the presence of the transparent layer. U.S. Pat. Nos. 4,532,372 and 4,598,306 describe that, by using the transparent layer which has a suitable resistance value, an excessive current is prevented from flowing between electrodes even if the semiconductor layers are short-circuited somewhere.

As another measure for increasing conversion efficiency of thin film solar cells, it is known to provide the surface of the solar cell or/and the interface between the back reflector and the semiconductor layers with fine ruggedness (a texture structure). The texture structure is effective in scattering the sunlight at the surface of the solar cell or/and the interface between the back reflector and the semiconductor layers, and trapping the sunlight inside the semiconductor layers (called the light trapping effect), enabling the sunlight to be effectively absorbed in the semiconductors. It is thus known that in the case of using a transparent substrate and introducing the sunlight from the substrate side, the surface of a transparent electrode, made of tin oxide ($SnO_2$), on the substrate is formed into the texture structure, and in the case of introducing the sunlight from the surface of the thin film semiconductor layers, the surface of a metal layer as part of the back reflector is formed into the texture structure.

M. Hirasaka, K. Suzuki, K. Kakatani, M. Asano, M. Yano and H. Okaniwa report that a texture structure for the back reflector is produced by depositing Al while adjusting the substrate temperature and the deposition rate (see Solar Cell Materials, 20(1990), pp 99–110). FIG. 2 shows, by way of example, an increase in absorptivity of the incident light resulted from forming the back reflector with the texture structure. In FIG. 2, a curve (a) represents spectral sensitivity of an a-Si solar cell using a smooth Ag layer as the metal layer, and a curve (b) represents spectral sensitivity of an a-Si solar cell using an Ag layer with the texture structure.

To achieve even higher conversion efficiency, it is conceivable to combine the concept of the back reflector comprising two layers, i.e, the metal layer and the transparent layer, and the concept of the texture structure with each other. U.S. Pat. No. 4,419,533 discloses the back reflector in which the surface of the metal layer has the texture structure and the transparent layer is formed on the metal layer. It is expected that conversion efficiency of solar cells is remarkably improved by such combination.

For increasing conversion efficiency of solar cells, the texture structure desirably has a texture period (pitch) not less than 0.5 µm. To obtain such a texture period, however, it is required to reduce the deposition rate and increase the film thickness. Accordingly, a batch type film forming sputtering process is time consuming, and a so-called roll-to-roll type sputtering process in which films are deposited in turn while feeding a long substrate continuously in the lengthwise direction entails many targets, increasing the apparatus size as a whole. Thus, in the present state of art, the problems of apparatus size and handling make it difficult to realize efficient mass production of thin film solar cells.

Furthermore, for producing the back reflector with high reflectivity, it is required to increase the thickness of the metal layer and reduce the deposition rate. Ag having high reflectivity is suitable as a material of the metal layer. But since Ag is expensive, if Ag is deposited thickly the material cost would compete with a desire to reduce the cost of solar cells. Also, the reduced deposition rate would deteriorate efficiency of mass production and entail a problem in relation to the apparatus. In other words, it has been difficult to use the conventional methods to market inexpensive solar cells which have high performance.

SUMMARY OF THE INVENTION

In view of the state of art described above, an object of the present invention is to provide a solar cell manufacturing method which can efficiently mass-produce back reflectors with high reflectivity, and a solar cell manufacturing apparatus which can be used to efficiently mass-produce the back reflectors.

Another object of the present invention is to provide a manufacturing method of inexpensive solar cells which can be manufactured at a low material cost, but have high performance.

Still another object of the present invention is to provide a manufacturing method of a solar cell comprising at least a metal layer having a texture structure and high reflectivity, a transparent layer, a semiconductor layer, and a transparent electrode which are formed on a substrate, wherein the metal layer consists of at least two layers formed as a first metal layer and a second metal layer, and the method includes a step of, after forming the first metal layer, annealing the first metal layer before forming the second metal layer.

Still another object of the present invention is to provide a solar cell manufacturing apparatus which requires only a small space for installation.

Still another object of the present invention is to provide a solar cell manufacture apparatus which includes a substrate delivery chamber, a substrate heating chamber, and a metal layer forming chamber in this order, and which can be used to manufacture a semiconductor device such as a solar cell.

DESCRIPTION OF THE PREFERRED EMBODIMENTS

Operation and embodiments of the present invention will be described below in detail with reference to experiments made in the course of studies to accomplish the present invention.

Taking, as an example, a solar cell of the structure shown in a schematic sectional view of FIG. 3, a solar cell manufacturing method for the present invention will first be described.

Figure 3:
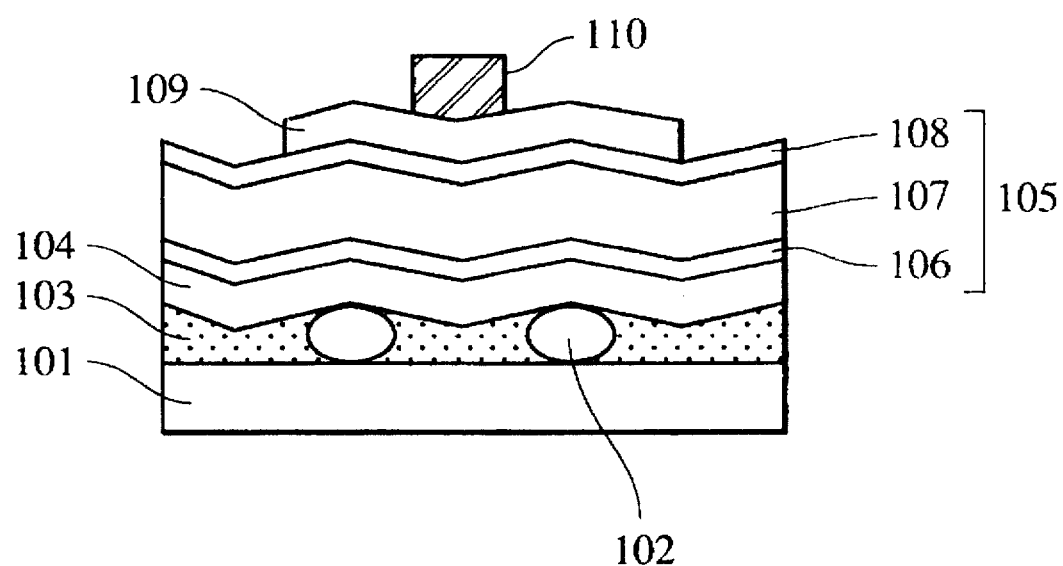
FIG. 3 is a schematic sectional view to explain one preferred example of a solar cell of the present invention.

In FIG. 3, reference numeral 101 is a substrate, 102 a first metal layer, 103 a second metal layer, 104 a transparent layer, 105 a semiconductor layer region, 106 an n-type amorphous silicon (a-Si), 107 an i-type a-Si layer, 108 an p-type a-Si layer, 109 a transparent electrode, and 110 a collector electrode.

More specifically, in the solar cell of FIG. 3, the first metal layer 102 is partially formed on the substrate 101, the second metal layer 103 is formed on and/or around the first metal layer 102, and the transparent layer 104 is formed on the second metal layer 103. On the transparent layer 104, the semiconductor layer region 105 is formed which comprises the n-type a-Si layer 106, the i-type a-Si layer 107 and the p-type a-Si layer 108 formed in this order to provide the so-called pin-structure. The transparent electrode 109 is formed on the semiconductor layer region 105, and the collector electrode 110 is formed on the transparent electrode 109 for efficiently collecting electricity generated.

The solar cell of the above structure is manufactured, by way of example, as follows.

First, the first metal layer 102, the second metal layer 103 and the transparent layer 104 are formed on the substrate 101, thereby forming a back reflector. The substrate 101 used in the present invention is preferably conductive at least at its surface. For example, the substrate 101 is preferably formed of a metal substrate, or formed by plating a metal on the surface of a non-conductive support member. After forming the first metal layer 102 on the substrate 101, the first metal layer 102 is annealed to produce aggregate particles 102 for providing a texture structure. Depending on film forming conditions, a fine texture structure may be formed in some cases without annealing. In any case, by annealing the first metal layer 102, the texture structure having a texture period not less than 0.5 μm can be finally provided.

The second metal layer 103 having high reflectivity is formed on and/or around the first metal layer 102 to increase reflectivity of the back reflector.

The transparent layer 104 is formed on the second metal layer 103. The transparent layer 104 is transparent to part of the sunlight which has passed through the semiconductor layer region 105. The transparent layer 104 has an appropriate value of electrical resistance and its surface also has a texture structure. Further, the transparent layer 104 is preferably resistant against reagents such as etchants used in later steps.

Subsequently, the semiconductor layer region 105 is formed on the back reflector thus formed. As mentioned above, FIG. 3 shows one example of the a-Si solar cell having the semiconductor layer region 105 of the pin-structure, i.e., the n-type a-Si layer 106, the i-type a-Si layer 107 and the p-type a-Si layer 108. When the semiconductor layer region 105 is thin, the entire region 105 also often exhibits a similar texture structure to that of the transparent layer 104 as illustrated in FIG. 3.

Finally, the transparent electrode 109 and the collector electrode 110 are formed to complete the solar cell.

The following advantages are obtained from the above manufacture method.

(1) While the metal layer must have heretofore been deposited thickly to form the back reflector having high diffused reflectivity, the thick metal layer is no longer required because the texture structure is provided by annealing. Also, the production cost can be reduced by employing the metal layer of a two-layered structure and using an inexpensive metal, such as Cu and Al, as the first metal layer.

(2) Since the texture structure having a texture period not less than 0.5 μm can be developed by annealing for several minutes without reducing the deposition rate of the metal layer, mass production can be more efficiently achieved.

(3) Since the back reflector having high diffused reflectivity is formed, a solar cell having high conversion efficiency can be provided.

The metal used to form the first metal layer of the present invention is preferably able to develop aggregate particles by annealing for several minutes and includes, for example, Au, Ag, Cu, Al, Mg and alloys thereof. The metal used to form the second metal layer preferably has reflectivity not less than 85% for light of wavelength ranging from 600 nm to 1200 nm, and its suitable examples are Al, Au, Ag and Cu. Among them, Ag having reflectivity not less than 98% is most suitable. While the above description is made in connection with the metal layer of a two-layered structure, the metal layer may consist of three or more layers insofar as the advantages of the present invention are achieved. In order to develop the effective texture structure, the first metal layer is formed to have a thickness preferably in the range of 400 to 4000 angstroms, more preferably in the range of 600 to 2500 angstroms, followed by annealing. The thickness of the second metal layer is selected so as to provide at least necessary reflective power and is preferably, for example, not less than 350 angstroms. More preferably, the second metal layer has a thickness not more than 1000 angstroms in view of the use of an expensive material such as Ag and the film forming time, but not less than 500 angstroms in view of effective reflective power and conductivity.

A description will now be made of experiments to demonstrate the operation and advantages of the present invention.

(Experiment 1)

On a 5×5 cm stainless substrate (SUS 430) of 2000 angstroms, Ag was deposited as the first metal layer by the DC magnetron sputtering process (deposition rate: 120 angstroms/sec). During the process, the substrate temperature was set to 200° C. The substrate having the first metal layer was annealed at 400° C. for 3 minutes in an atmosphere of Ar of 99.999% (5N) at a flow rate of 1 liter/min. The resulting sample will be referred to as a sample 1a.

Then, other samples were manufactured using Cu, Al, Mg, Zn and Ni as the first metal layer in the same manner as with the sample 1a. The resulting samples will be referred to as, respectively, samples 1b, 1c, 1d, 1e and 1f.

Figure 4:
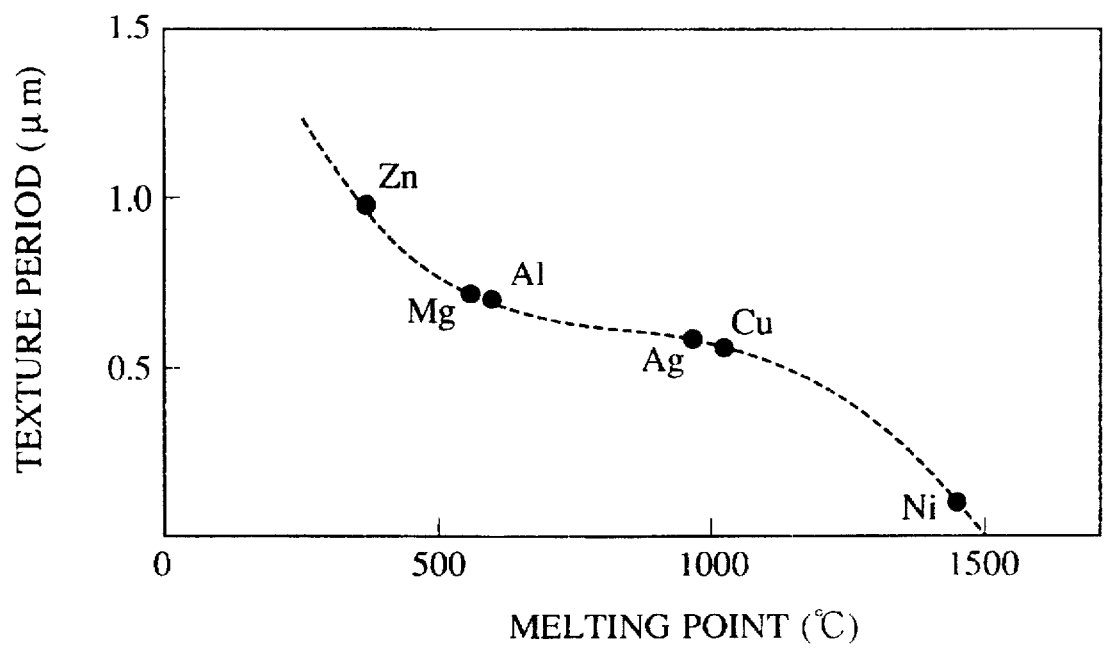
FIG. 4 is a graph to explain the relationship between a texture period (pitch) after annealing and differences in melting point of metals.

These six samples thus prepared were observed by using an SEM to determine a texture period. The relationship between the texture period after annealing and the melting points of the metals is shown in FIG. 4. As seen from FIG. 4, for the metals having the melting points not higher than 1100° C., the texture period is not less than 0.5 μm and the satisfactory texture structure is provided.

On the other hand, it has also been found that when the metal having the low melting point is used to form the first metal layer, the reflectivity may be reduced because of mutual diffusion caused when the sample is subject to temperatures above 350° C. in steps after depositing the second metal layer. In consideration of results of many repeated experiments including those above, the melting point of the metal suitable as the first metal layer is in the range of 650° to 1100° C.

(Experiment 2)

Samples 2a-1, 2a-2, 2a-3, 2a-4 and 2a-5 were manufactured in the same manner as with the sample 1a except that the annealing temperature was set to 150° C., 200° C., 400° C., 500° C. and 600° C. in Experiment 1.

Also, samples 2b-1, 2b-2, 2b-3, 2b-4 and 2b-5 were manufactured in the same manner as with the sample 1b except that the annealing temperature was set to 150° C., 200° C., 400° C., 500° C. and 600° C. in Experiment 1.

Figure 5:
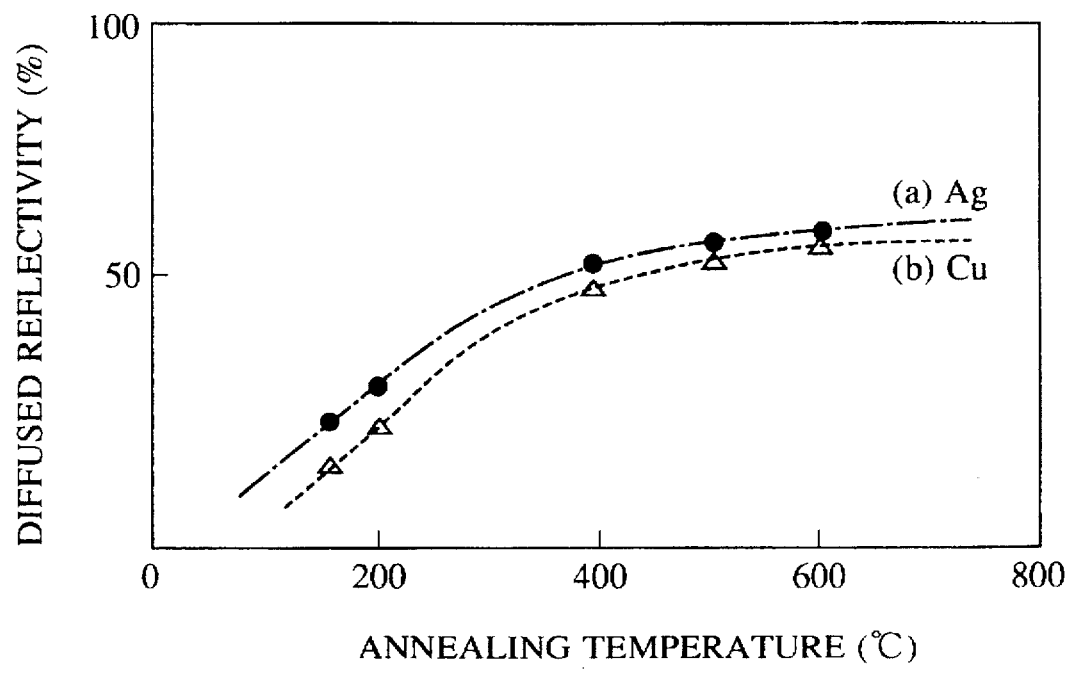
FIG. 5 is a graph to explain the relationship between an annealing temperature and diffused reflectivity.

The relationships between diffused reflectivity and the annealing temperature measured for the samples 2a-1 to 2a-5 and the samples 2b-1 to 2b-5 are represented by curves (a) and (b) in FIG. 5, respectively. As seen from FIG. 5, as the annealing temperature rises, the diffused reflectivity is increased and the texture is more developed.

However, it has been found that when the annealing temperature exceeds 500° C., a distortion may occur in the substrate, reducing adhesion of the films in the completed solar cells. For this reason, the annealing temperature is preferably in the range of 200° to 500° C.

(Experiment 3)

On the sample 1a manufactured in Experiment 1,6000 angstroms Ag was further deposited at the substrate temperature of 200° C., thereby manufacturing a sample 3a.

For comparison, a sample 3b was manufactured by depositing 2000 angstroms Ag on a 5×5 cm stainless substrate (SUS 430) by the DC magnetron sputtering process with the substrate temperature set to 500° C.

Results of measuring reflectivity of the samples 3a and 3b are listed in Table 1. As seen from Table 1, in spite of having a thinner film thickness, the sample 3a exhibits higher reflectivity than the sample 3b. This means that the better texture structure can be provided by annealing.

TABLE 1

|  |  | Wavelength [nm] | | | |
|---|---|---|---|---|---|
|  |  | 600 | 800 | 1000 | 1200 |
| Sample 3a | Total Reflectivity | 99.4 | 99.6 | 99.8 | 99.9 |
|  | Diffused Reflectivity | 62.5 | 51.0 | 44.4 | 45.2 |
| Sample 3b | Total Reflectivity | 99.2 | 98.7 | 98.3 | 99.2 |
|  | Diffused Reflectivity | 61.3 | 39.0 | 23.4 | 13.7 |

(Experiment 4)

After applying the sample 1a formed in Experiment 1 as the first metal layer and forming 600 angstroms Ag as the second metal layer on the first metal layer, 1000 angstroms ZnO was formed as the transparent layer. Further, by using the glow discharge decomposition process, a 200 angstroms n-type a-Si layer was deposited from $SiH_4$ and $PH_3$ as material gases, 4000 Å i-type a-Si layer was deposited from $SiH_4$ as material gas, and a 100 angstroms p-type microcrystalline (μc)-Si layer was deposited from $SiH_4$, $BF_3$ and $H_2$ as material gases, thereby forming the semiconductor layer region. On the semiconductor layer region, a 650 angstroms ITO film was deposited as the transparent electrode by the resistance heating evaporation process. The collector electrode having a width of 300 microns was then formed on the ITO film using a silver paste. The resulting sample will be referred to as sample 4a.

For comparison, a sample 4b was manufactured in the same manner as sample 4a except that 4500 angstroms Ag was deposited as the back reflector on the substrate at the deposition rate of 60 angstroms/sec.

Conversion efficiency was measured on the samples 4a and 4b by using a solar simulator of AM-1.5. As a result, it was found that the conversion efficiency of the comparative sample 4b was 9.0%, whereas the sample 4a prepared by the manufacture method of the present invention had higher conversion efficiency, i.e., 9.6%.

The back reflector used in the solar cell of the present invention will now be described in more detail.

Substrate and Metal layer

Various metals can be used as the substrate. Substrates made of stainless steel, zinc steel, aluminum, copper and so on are preferable because of having a sufficient degree of strength and being relatively inexpensive. When used, these metal plates may be cut into a certain size, or may be in the form of a long sheet depending on a desired plate thickness. In the latter case, the substrate can be wound into a roll which is suitable for continuous production and is easily stored and transported. Depending on the application, a crystalline plate such as silicon, or other plates of glass and ceramic may also be used. While the surface of the substrate is preferably polished, the plate having a good finish condition, e.g., a stainless plate treated by bright annealing, can be used as it is.

Figure 1A:
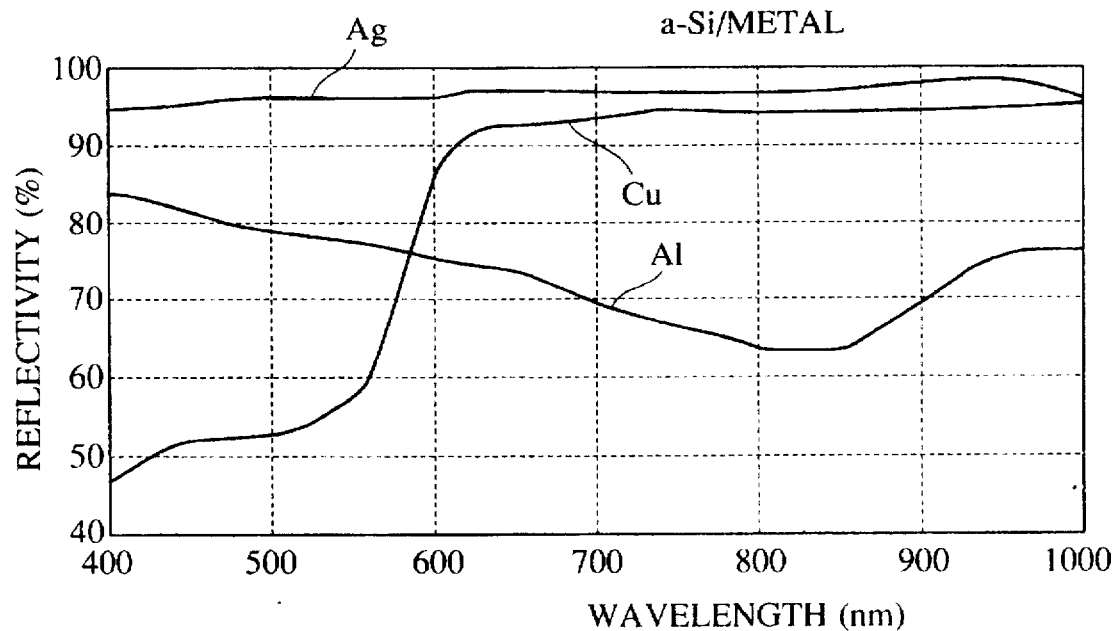
FIGS. 1A and 1B are graphs to explain a difference in reflectivity resulting from providing a transparent layer with respect to different wavelengths.
Figure 1B:
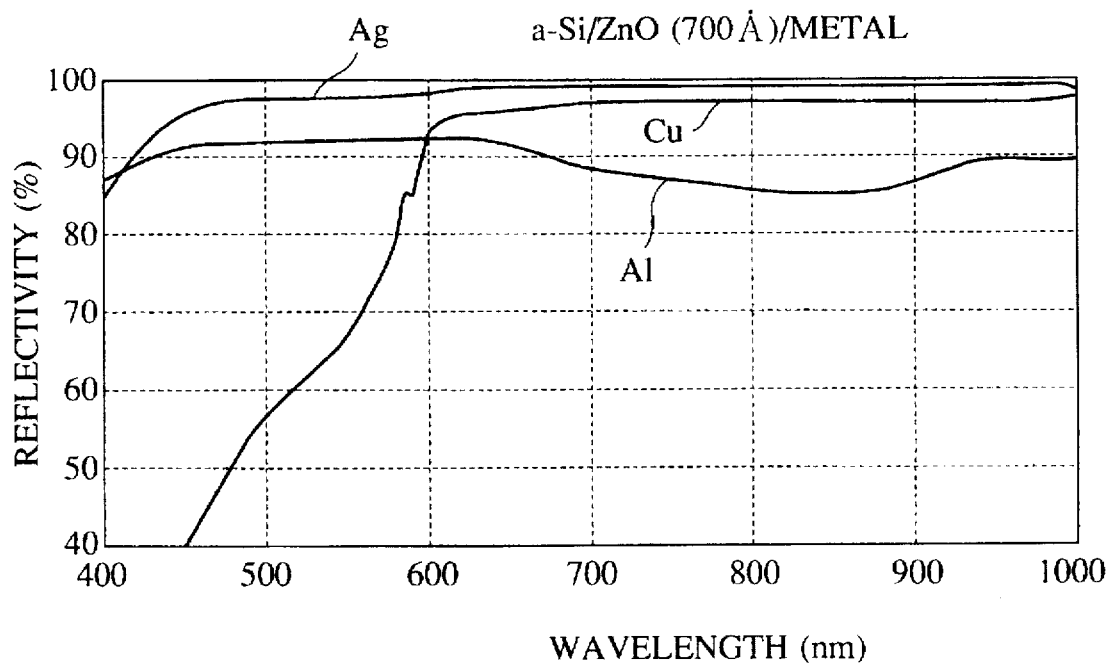
Figure 2:
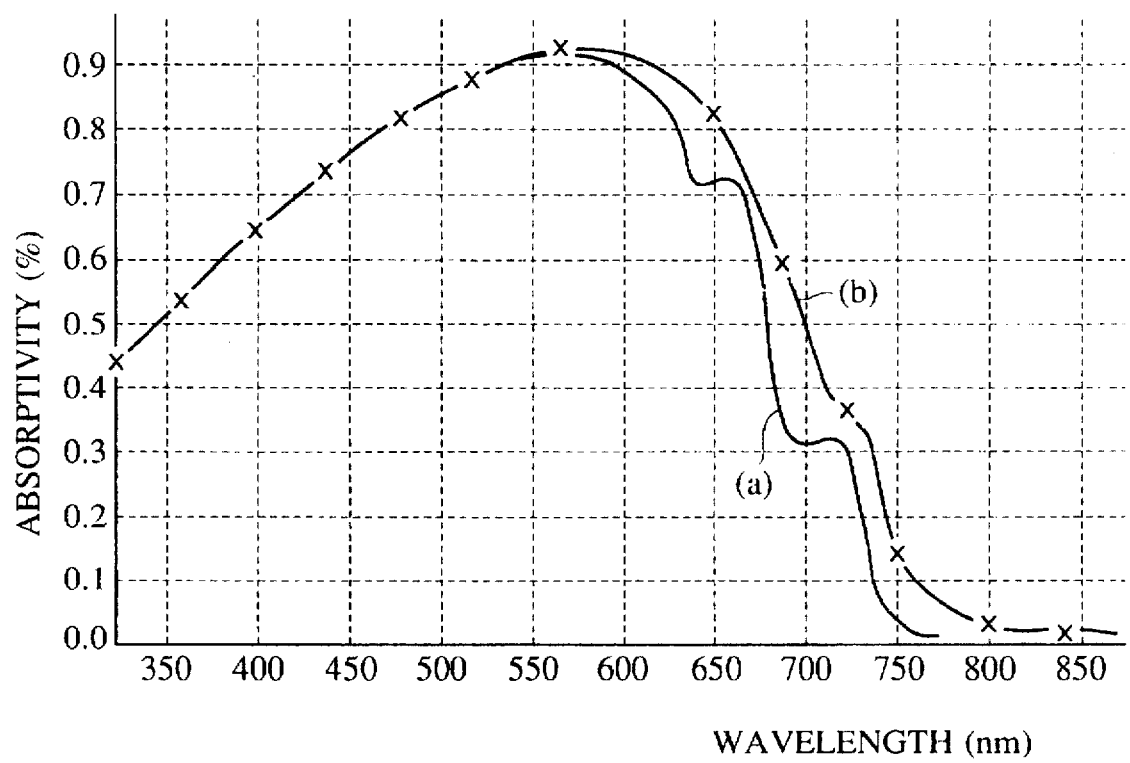
FIG. 2 is a graph to explain the effect of a texture structure upon spectral sensitivity.

The metal layer formed on the substrate made of stainless steel, zinc steel or the like is preferably formed of a metal such as silver or aluminum which has high reflectivity over the entire wavelength range. But since a short wavelength component in spectrum of the sunlight is absorbed by the semiconductor layer region, it is enough for the metal layer to have high reflectivity to the light in the range of longer wavelength than the absorbed range. The wavelength at or longer than which the metal layer should have high reflectivity depends on the light absorptivity and the film thickness of the semiconductor layer region. In the case of a-Si having a thickness of 4000 angstroms, for example, the boundary wavelength is about 6000 angstroms and, therefore, copper can be preferably used (see FIGS. 1A and 1B).

The metal layer in the present invention also functions as the other electrode (lower electrode) opposite to the transparent electrode. When the substrate made of glass or ceramic has too large a resistance, a conductive layer made of metal may be additionally provided.

Figure 6:
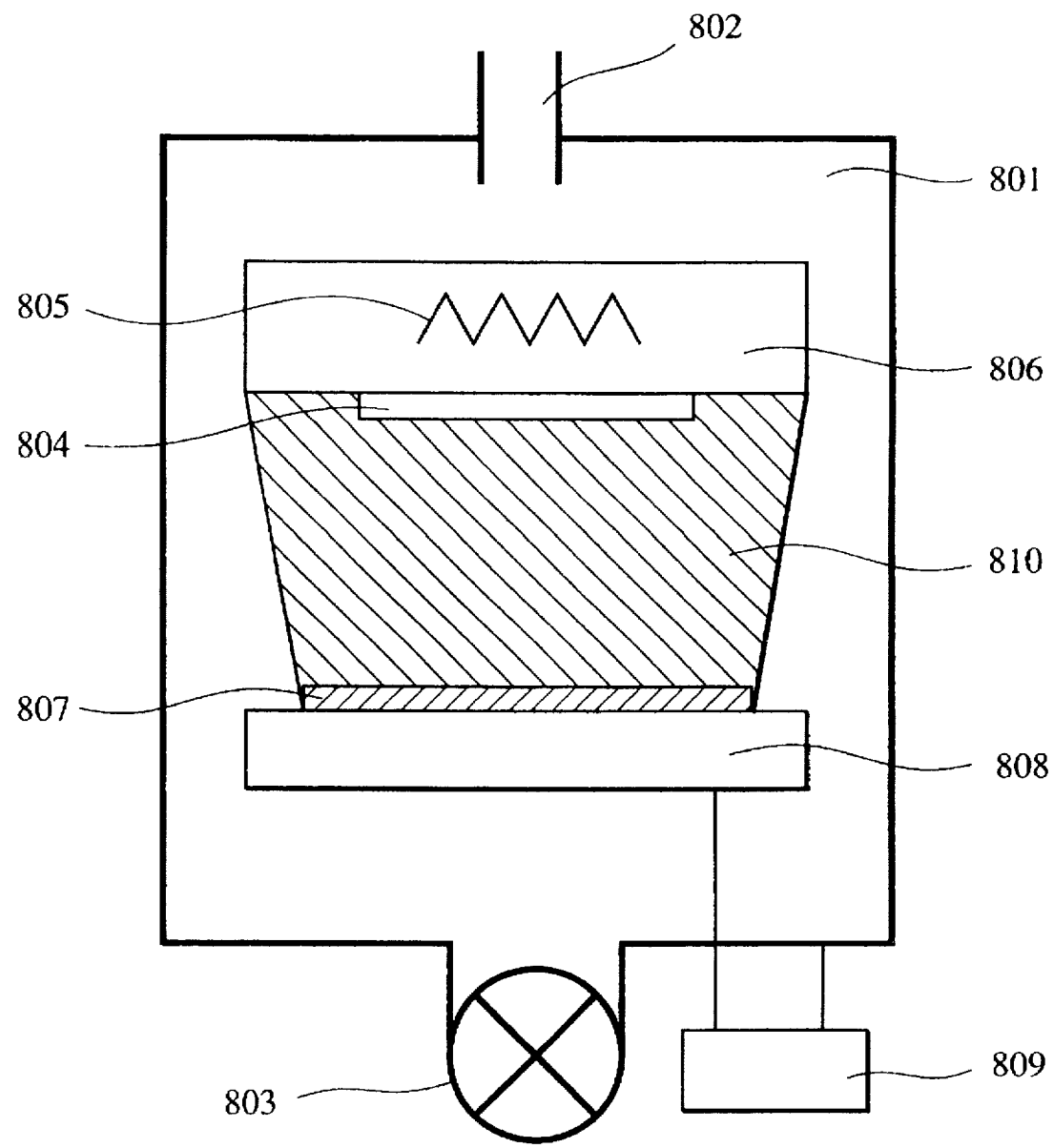
FIG. 6 is a schematic sectional view to explain one example of a structure of a preferred sputtering apparatus.

The metal layer can be deposited by any process of vacuum evaporation using resistance heating or an electron beam, sputtering, ion plating, CVD, plating, etc. A description will now be made of, as one preferable example of the film forming processes, the case of forming the metal layer by sputtering. FIG. 6 shows one preferable example of sputtering apparatus. Referring to FIG. 6, 801 is a deposition chamber which can be evacuated by an evacuation pump (not shown) to create a vacuum. Inert gas such as argon (Ar) is introduced to the deposition chamber 801 at a predetermined flow rate through a gas conduit 802 connected to a gas bomb (not shown). The Ar atmosphere in the deposition chamber 801 is held at a predetermined pressure by adjusting an opening of an evacuation valve 803. A substrate 804 is fixed to a lower surface of an anode 806 in which a heater 805 is disposed. A cathode electrode 808 including a target 807 fixed to its upper surface is disposed in opposite relation to the anode 806. The target 807 is a block made of a metal to be deposited. While the target is usually made of a pure metal with purity on the order of 99.9% to 99.999%, the metal may be mixed with a specific impurity in some cases. The cathode electrode 808 is connected to a power supply 809. A high voltage of radio frequency (RF) or direct current (DC) is applied to the cathode electrode 808 from the power supply 809 to produce plasma 810 between the cathode and anode electrodes. Under the action of the plasma 810, metal atoms of the target 807 are deposited on the substrate 804. The deposition rate can be raised by using a magnetron sputtering apparatus that a magnet is disposed in the cathode 808 to increase the intensity of the plasma.

Transparent Layer and Its Texture Structure

As materials of the transparent layer, an oxide containing at least one metal selected from the group consisting of Zn, In, Sn, Cd and Ti, e.g., indium oxide ($In_2O_3$), tin oxide ($SnO_2$), cadmium oxide (CdO), tin cadmium oxide ($CdSnO_4$), titanium oxide (TiO), as well as zinc oxide(ZnO) (note that the composition ratio of the compound given herein is not always in agreement with the actual ratio; i.e., the composition ratio is not limited to the expressed stoichiometric ratio). It is generally preferable for the transparent layer to have transmissivity of light as high as possible, but the transparent layer is not necessarily transparent to the light having a wavelength that is absorbed by the semiconductor layer region before reaching the transparent layer. While the transparent layer should have resistance sufficient to suppress a current caused by pin holes or the like, its resistance value must be held within the range in which the influence of a resulting serial resistance loss upon conversion efficiency of the solar cell is negligible. For this reason, the resistance of the transparent layer per unit area (1 cm$^2$) is preferably in the range of $10^{-6}$ to $10\Omega$, more preferably in the range of $10^{-5}$ to $3\Omega$, most preferably in the range of $10^{-4}$ to $1\Omega$.

The specific resistance of the transparent layer can be controlled by adding a suitable impurity. When used as the transparent layer in the present invention, pure conductive oxides described above are often too low in specific resistance. Therefore, a preferable impurity is one which increases the resistance of the conductive oxide when added. For example, by adding the proper amount of an acceptor impurity to the transparent layer formed of an n-type semiconductor (e.g., Cu to ZnO or Al to $SnO_2$) and forming an intrinsic region, the specific resistance of the transparent layer can be increased. The addition of an impurity also contributes to increasing resistance against reagents.

The thickness of the transparent layer is preferably as thin as possible from the standpoint of transparency, but its average thickness is desired to be not less than 1000 angstroms to provide the layer surface with a texture structure. Taking into account reliability as well, the layer thickness larger than the above average thickness is necessary in some cases.

The transparent layer can be deposited by any process of vacuum evaporation using resistance heating or an electron beam, sputtering, ion plating, CVD, spray coating, etc. The sputtering process as one preferred example of the film forming processes can be performed by using the sputtering apparatus shown in FIG. 6. However, an oxide can be deposited by using a target made of the oxide itself or a target made of a metal (such as Zn or Sn). In the latter case, a reactive sputtering process must be used in which the metal is sputtered while introducing oxygen to the deposition chamber together with Ar.

An impurity can be added to the transparent layer by adding the desired impurity to an evaporation source or the target. Particularly, when the transparent layer is deposited by sputtering, a small piece of material containing the desired impurity may be placed on the target.

The reason why light is trapped by providing the texture structure is presumably in that the texture structure developed on the metal layer scatters the light when reflected by the metal layer. If the surface of the semiconductor layer region also has a similar texture structure to that of the transparent layer, the light is more apt to scatter due to phase difference of the light and hence the light trapping effect is increased.

The present invention will be described below in more detail in conjunction with Examples, but it should be understood that the present invention is not limited to the following Examples.

EXAMPLE 1

In this Example 1, a pin-type a-Si optical electromotive force device of the structure shown in the schematic sectional view of FIG. 3 was manufactured. On the sample 1a manufactured in Experiment 1,600 angstroms Ag was formed and, by using the sputtering apparatus shown in FIG. 6, the ZnO film 104 was deposited in an average thickness of 10000 angstroms at the substrate temperature of 250° C. using a ZnO target. The surface of the ZnO film had a texture structure.

Figure 7:
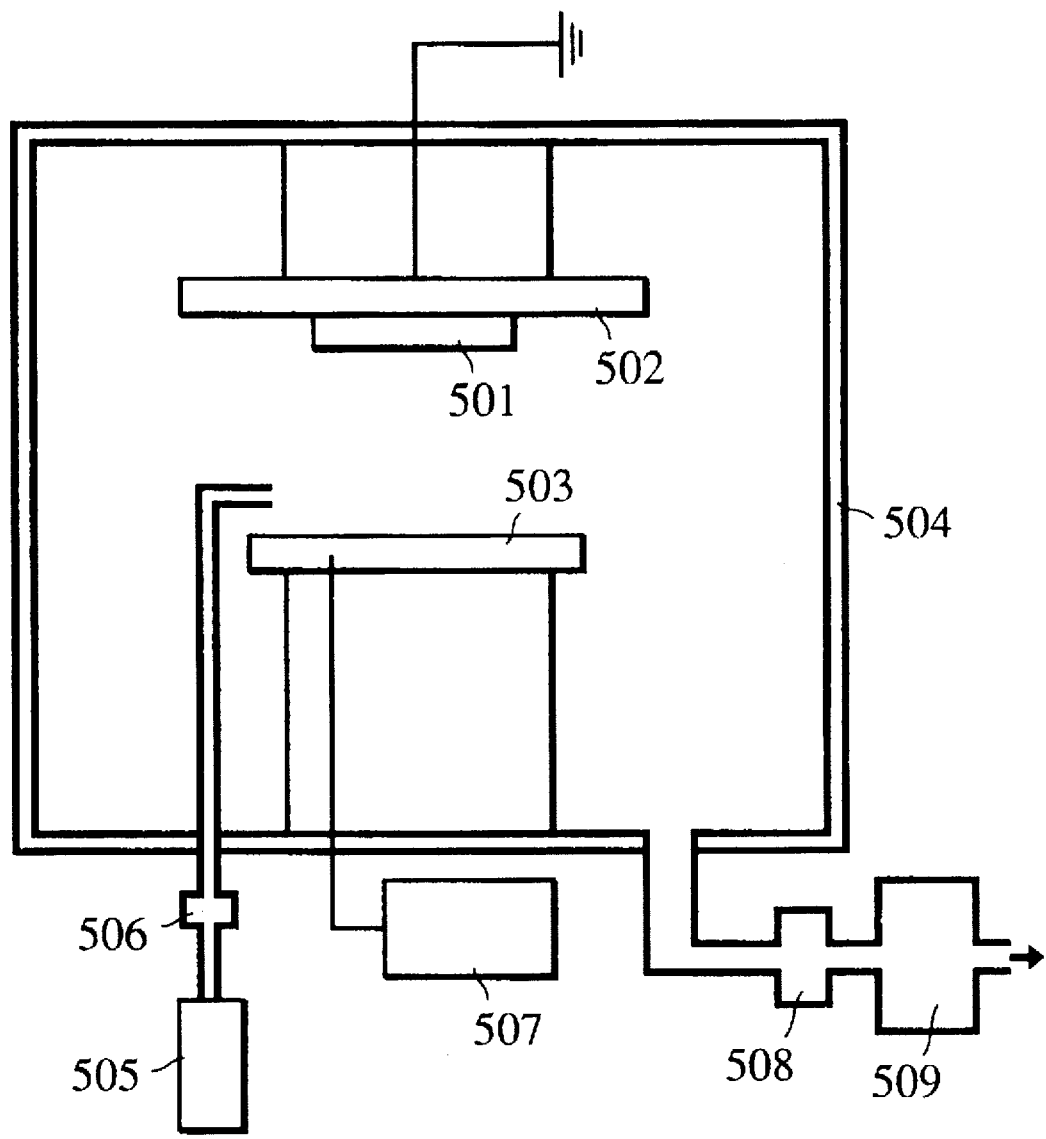
FIG. 7 is a schematic sectional view to explain one example of a structure of a preferred plasma CVD (PCVD) apparatus.

Subsequently, as shown in FIG. 7, a substrate 501 having the thus-formed lower electrode was set on the underside of a rest 502, which serves also as an electrode, in a commercially available capacity coupling type high-frequency CVD apparatus (CHJ-3030 by ULVAC Co.). An evacuation pump 509 was operated to purge air in a reaction vessel 504 through an evacuation pipe with steps of rough evacuation and then high-vacuum evacuation. At this time, the surface temperature of the substrate was controlled to 250° C. by a temperature control unit.

When a sufficiently high degree of vacuum was created, $SiH_4$ of 300 sccm, $SiF_4$ of 4 sccm, $PH_3/H_2$ (diluted with $H_2$ of 1% of 55 sccm, and $H_2$ of 40 sccm were introduced to the reaction vessel from gas supply means 505, and an opening of a throttle valve 506 was adjusted to keep an internal pressure of the reaction vessel 504 at 1 Torr. Immediately after the pressure is stabilized, power of 200 W was applied to an electrode 503 from a high-frequency power supply 507. Plasma was maintained for 5 minutes and the n-type a-Si layer 106 was formed on the transparent layer 104.

After evacuating the reaction vessel again, $SiH_4$ of 300 sccm, $SiF_4$ of 4 sccm, and $H_2$ of 40 sccm were introduced from the gas supply means 505, and an opening of the throttle valve 506 was adjusted to keep an internal pressure of the reaction vessel at 1 Torr. Immediately after the pressure was stabilized, power of 150 W was applied to the electrode 503 from the high-frequency power supply 507. Plasma was maintained for 40 minutes and the i-type a-Si layer 107 was formed on the n-type a-Si layer 106.

After evacuating the reaction vessel again, $SiH_4$ of 50 sccm, $BF_3/H_2$ (diluted with $H_2$ of 1%) of 50 sccm, and $H_2$ of 500 sccm were introduced from the gas supply means 505, and an opening of the throttle valve 506 was adjusted to keep an internal pressure of the reaction vessel at 1 Torr. Immediately after the pressure was stabilized, power of 300 W was applied to the electrode 503 from the high-frequency power supply 507. Plasma was maintained for 2 minutes and the p-type µc-Si layer 108 was formed on the i-type a-Si layer 107.

Then, the sample was taken out of the high-frequency CVD apparatus and, after depositing ITO thereon in a resistance heating vacuum evaporation apparatus, a paste containing a ferrous chloride solution was printed on the deposited ITO so that the transparent electrode 109 was formed in a desired pattern. Finally, a Ag paste was screen-printed and then hardened to form the collector electrode 110, thereby completing a thin film semiconductor solar cell.

Ten samples were manufactured by the above method and their characteristics were evaluated under irradiation of light of AM-1.5 (100 mW/cm$^2$). As a result, the samples showed excellent photoelectric conversion efficiency of 9.5±0.2% with good reproducibility.

EXAMPLE 2

Figure 8:
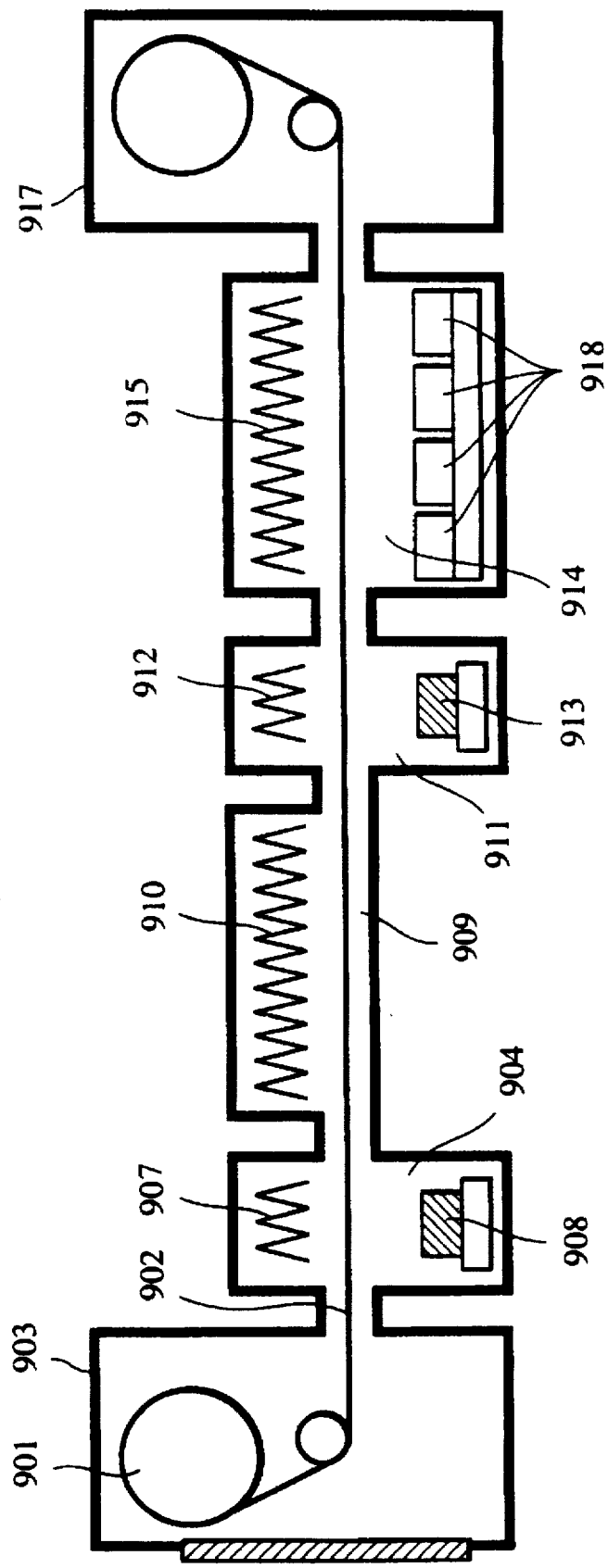
FIG. 8 is a schematic sectional view to explain one preferred example of a manufacturing apparatus of the present invention.

The rear reflecting surface was formed in a continuous manner by using an apparatus shown in FIG. 8. A cleaned stainless sheet roll 901 being 350 mm wide, 0.2 mm thick and 500 m long was set in a substrate pay off chamber 903 of the apparatus. From the chamber 903, a stainless sheet 902 was advanced to a substrate take up chamber 917 through a first metal layer deposition chamber 904 including a target 908 made of a first metal, an annealing chamber 909, a second metal layer deposition chamber 911 including a target 913 made of a second metal, and a transparent layer deposition chamber 914 including targets 918 to form the transparent layer. The sheet 902 was heated by substrate heaters 907, 910, 912, 915 in the respective deposition chambers to desired temperatures.

The target 908 in the first metal layer deposition chamber 904 was made of Al with purity of 99.99% for depositing an Al layer of 2400 angstroms on the sheet 502 by DC magnetron sputtering while the substrate was heated to temperature of 150° C.

The Al layer on the sheet 902 was annealed at 300° C. by the heater 910 disposed in the annealing chamber 909 for developing a texture structure. After that, in the second metal layer deposition chamber 911, another Al layer of 600 angstroms was deposited similarly to the above Al layer by using the target 913 made of Al with purity of 99.99% on the sheet 502 while the substrate was heated to a temperature of 150° C.

The targets 918 in the transparent layer deposition chamber 914 was made of ZnO with 99.5% purity (the rest 0.5% being Cu) for depositing a ZnO layer of 10000 angstroms on the Al layer by DC magnetron sputtering (substrate temperature: 250° C.). In view of the deposition rate and the desired film thickness, the four targets 918 were employed.

The sheet feed speed was set to 20 cm per minute.

Figure 9:
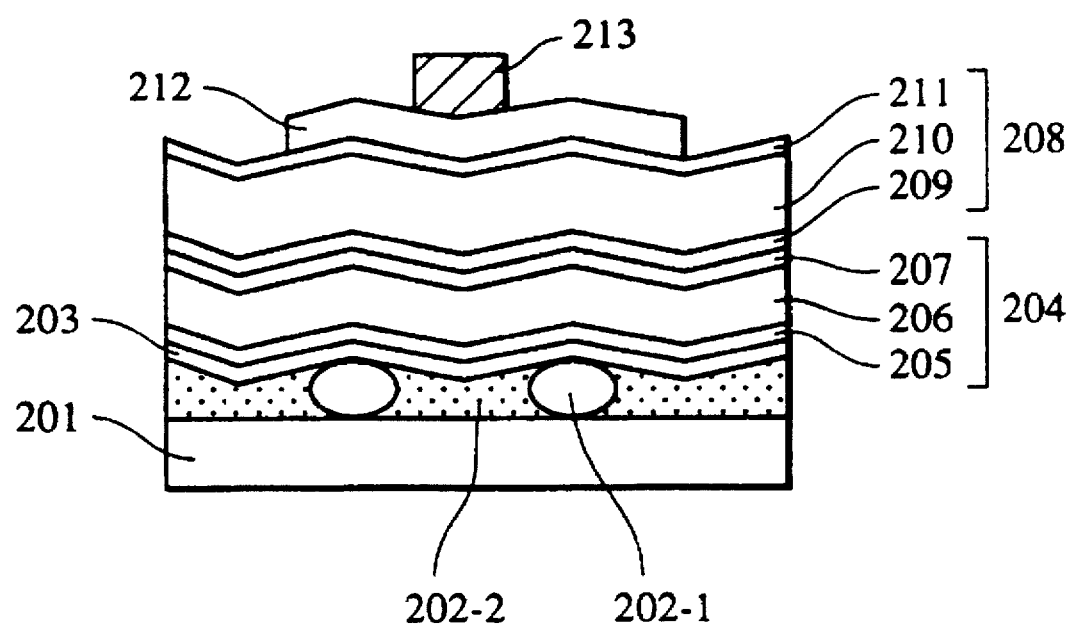
FIG. 9 is a schematic sectional view to explain another preferred example of a solar cell of the present invention.

On the ZnO layer, semiconductor layer regions, a transparent electrode and a collector electrode were formed to manufacture an a-Si/a-SiGe type tandem solar cell of the structure, having two pin-structures, as shown in FIG. 9. In FIG. 9, reference numeral 201 denotes a substrate, 202-1 a first metal layer, 202-2 a second metal layer, 203 a transparent layer, 204 a bottom cell, and 208 a top cell. Further, 205, 209 denote n-type a-Si layers, 207, 211 p-type µc-Si layers, 206 an i-type a-SiGe layer, and 210 an i-type a-Si layer. These semiconductor layers were fabricated in turn in a continuous manner by using a roll-to-roll film forming apparatus as disclosed in U.S. Pat. No. 4,492,181. A transparent electrode 212 was deposited by using a sputtering apparatus similar to that shown in FIG. 9. 213 is a collector electrode. After patterning the transparent electrode and forming the collector electrode, the sheet 902 was cut into separate devices. By thus carrying out all the steps in a continuous manner, the efficiency of mass production could be increased.

100 samples were manufactured by the above-described method and their characteristics were evaluated under irradiation of light of AM-1.5 (100 mW/cm$^2$). As a result, the samples showed excellent photoelectric conversion efficiency of 11.3±0.2% with good reproducibility.

EXAMPLE 3

Figure 10:
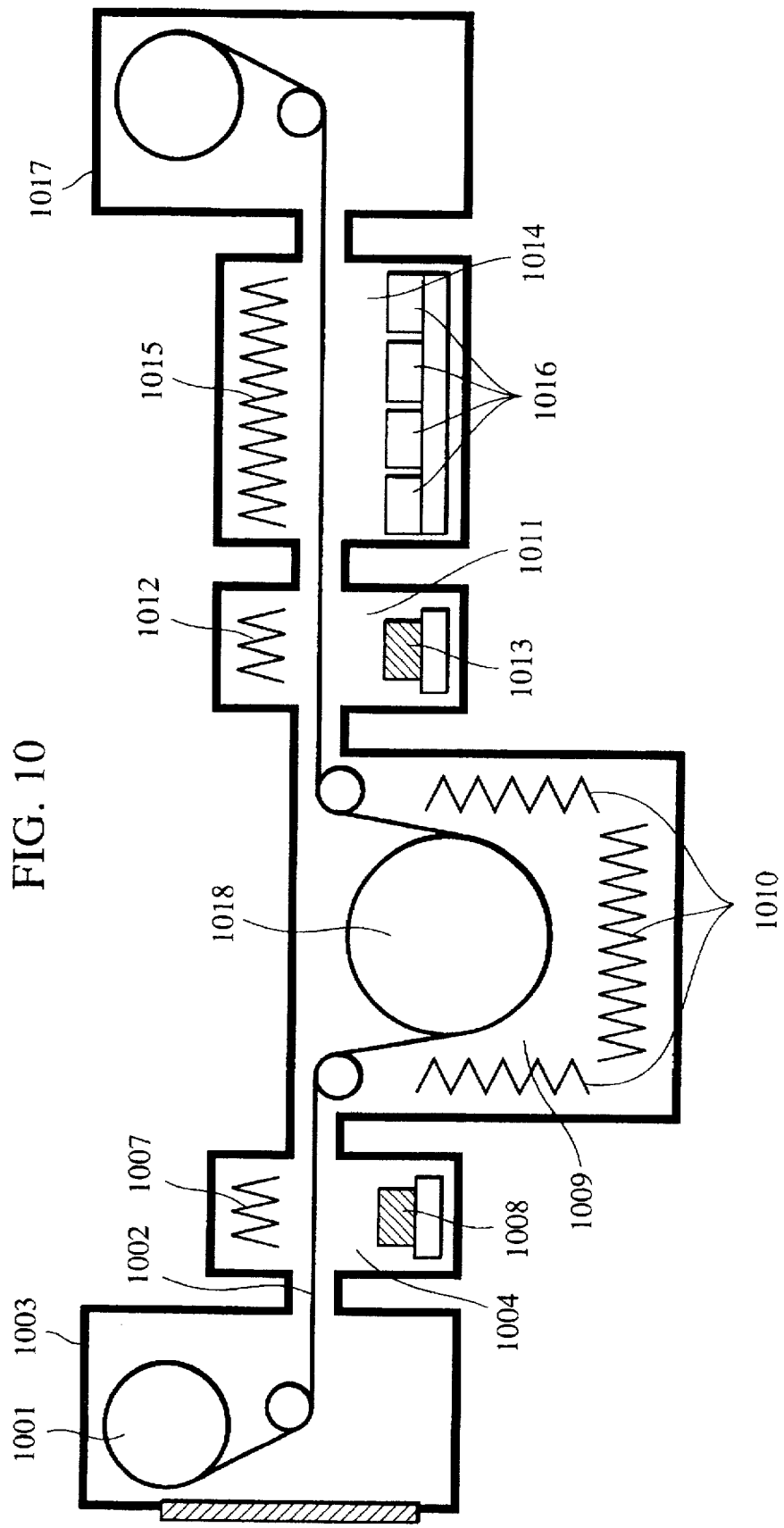
FIG. 10 is a schematic sectional view to explain another preferred example of a manufacture apparatus of the present invention.

FIG. 10 shows a modification of the apparatus shown in FIG. 8, in which the annealing chamber is improved. The manufacturing method is the same as in the apparatus of FIG. 8. In this Example 3, a roller 1018 is disposed in an annealing chamber 1009 and annealing was preformed by heaters 1010 disposed around the roller 1018. With this construction, the length and hence the bottom area of the apparatus can be reduced.

On the substrate processed by using the apparatus shown in FIG. 8, semiconductor layer regions, a transparent electrode and a collector electrode were formed in the same manner as in Example 2, thereby manufacturing 100 samples of solar cells of which characteristics were then evaluated likewise.

As a result, the samples of solar cells showed excellent photoelectric conversion efficiency of 11.2±0.2% with good reproducibility.

According to the present invention, as described hereinabove, the back reflector having high reflectivity of light can be manufactured at a low cost. Hence, solar cells having high conversion efficiency can be manufactured inexpensively.

Also, according to the present invention, since the back reflector can be formed with improved characteristics and in a stable condition, solar cells having higher conversion efficiency can be stably manufactured.

Furthermore, the present invention can provide a manufacturing apparatus suitably applicable to a roll-to-roll process which requires a small space, e.g., a bottom area, for installation of the apparatus.

Thus, the present invention greatly contributes to more widespread use of solar cells.

In addition to an amorphous semiconductor such as a-Si, the semiconductor layer region may be formed of a microcrystalline or polycrystalline semiconductor. In other words, the semiconductor layer region may be formed of a non-single crystal material.

It should be understood that the present invention is not limited to the above-described embodiments, Examples and description, and can be modified or combined with other features, if necessary, without departing from the scope of the invention.

What is claimed is:

1. A method of manufacturing a solar cell comprising at least a metal layer, a semiconductor layer and a transparent electrode, said metal layer being comprised of cohered metal and metal, the method comprising the steps of:
   (1) forming a first metal on a substrate;
   (2) annealing said first metal to form a plurality of spots of cohered metal, wherein the interval between each spot is not less than 0.5 μm; and
   (3) forming a second metal on and/or around said cohered metal, said cohered metal and said second metal thereby forming said metal layer.

2. A method of manufacturing a solar cell according to claim 1, wherein said first metal is made of a metal or an alloy of metal having a melting point of 500° to 1100° C.

3. A method of manufacturing a solar cell according to claim 1, wherein said second metal is made of a metal having reflectivity not less than 85% to light with a wavelength of 600 to 1200 nm.

4. A method of manufacturing a solar cell according to claim 1, wherein said annealing is performed at a temperature of 200° to 500° C.

5. A method of manufacturing a solar cell according to claim 1, wherein said first metal contains at least one element selected from the group consisting of Cu, Al, Mg, Au and Ag.

6. A method of manufacturing a solar cell according to claim 1, wherein said second metal contains at least one element selected from the group consisting of Al, Au, Ag and Cu.

7. A method of manufacturing a solar cell according to claim 1, wherein said first metal has a thickness of 400 to 4000 angstroms before said annealing step.

8. A method of manufacturing a solar cell according to claim 1, wherein said method further includes a step of forming a transparent layer on said second metal.

9. A method of manufacturing a solar cell according to claim 8, wherein said transparent layer has resistance of $10^{-6}$ to 10 Ω/cm$^2$.

10. A method of manufacturing method a solar cell according to claim 8, wherein said transparent layer has a thickness not less than 1000 angstroms.

11. A method of manufacturing method for a solar cell according to claim 8, wherein said transparent layer includes an oxide containing at least one metal selected from the group consisting of Zn, In, Sn, Cd and Ti.

12. A method of manufacturing method for a solar cell according to claim 1, wherein said semiconductor layer includes a semiconductor region formed by laminating a p-type semiconductor layer, an i-type semiconductor layer, and an n-type semiconductor layer.

13. A method of manufacturing method for a solar cell according to claim 1, wherein said semiconductor layer is formed of a non-single crystal material.

14. A method of manufacturing a solar cell according to claim 1, wherein said second metal is formed only between said plurality of spots of cohered metal.

* * * * *

UNITED STATES PATENT AND TRADEMARK OFFICE
CERTIFICATE OF CORRECTION

PATENT NO. : 5,668,050

DATED : September 16, 1997

INVENTOR(S): YUKIKO IWASAKI

It is certified that error appears in the above-identified patent and that said Letters Patent is hereby corrected as shown below:

TITLE PAGE at [56]
   OTHER PUBLICATIONS, "hydro-" should read --Hydro---.

COLUMN 1
   Line 7, "manufacture" should read --manufacturing--.

COLUMN 3
   Line 34, "manufacture" should read --manufacturing--;
   Line 66, "manufacture" should read --manufacturing--.

COLUMN 9
   Line 23, "this" should be deleted;
   Line 44, "1%" should read --1%)--.

UNITED STATES PATENT AND TRADEMARK OFFICE
CERTIFICATE OF CORRECTION

PATENT NO. : 5,668,050

DATED : September 16, 1997

INVENTOR(S) : YUKIKO IWASAKI

It is certified that error appears in the above-identified patent and that said Letters Patent is hereby corrected as shown below:

COLUMN 12
  Line 39, "method a" should read --a--;
  Line 42, "method for" should be deleted;
  Line 46, "method for" should be deleted;
  Line 51, "method for" should be deleted.

Signed and Sealed this

Thirty-first Day of March, 1998

Attest:

BRUCE LEHMAN

*Attesting Officer*     *Commissioner of Patents and Trademarks*